United States Patent
Raman et al.

(10) Patent No.: US 10,739,418 B2
(45) Date of Patent: Aug. 11, 2020

(54) RANDOMIZED SPINNING OF HALL PLATES

(71) Applicant: Melexis Technologies SA, Bevaix (CH)

(72) Inventors: Johan Raman, Knesselare (BE); Pieter Rombouts, Mariakerke (BE)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 16/503,803

(22) Filed: Jul. 5, 2019

(65) Prior Publication Data

US 2020/0011941 A1    Jan. 9, 2020

(30) Foreign Application Priority Data

Jul. 5, 2018    (EP) .................................... 18182041

(51) Int. Cl.
*G01R 33/07*    (2006.01)
*G01R 33/00*    (2006.01)

(52) U.S. Cl.
CPC ....... *G01R 33/075* (2013.01); *G01R 33/0029* (2013.01)

(58) Field of Classification Search
None
See application file for complete search history.

(56) References Cited

U.S. PATENT DOCUMENTS

| | | | |
|---|---|---|---|
| 9,685,967 B1 | 6/2017 | Motz et al. | |
| 2013/0093431 A1* | 4/2013 | Raman | G01L 1/144 324/537 |
| 2014/0210462 A1* | 7/2014 | Yamamoto | G01R 33/07 324/251 |
| 2015/0070002 A1* | 3/2015 | Schott | G01D 5/145 324/207.2 |
| 2017/0207761 A1 | 7/2017 | Raman et al. | |

FOREIGN PATENT DOCUMENTS

| | | |
|---|---|---|
| JP | 2008286695 A | 11/2008 |
| WO | 9854547 A1 | 12/1998 |
| WO | JP2018016510 A1 | 4/2019 |

OTHER PUBLICATIONS

Nobira Ryuji ; Current Sensor; WO 2018016510 A1; Asahi Kasei Microdevices Corp ; Published Jan. 25, 2018; GO1R15/202 (Year: 2018).*
Madec et al., "An Improved Compact Model of the Electrical Behaviour of the 5-Contact Vertical Hall-Effect Device," Analog Integrated Circuits and Signal Processing, vol. 81, No. 3, Nov. 28, 2014.
European Search Report for EP Application No. 18182041.6, dated Feb. 14, 2019.

* cited by examiner

*Primary Examiner* — Nasima Monsur
(74) *Attorney, Agent, or Firm* — Workman Nydegger

(57) ABSTRACT

A method of reading out a Hall plate which comprises at least 4 contacts. The method comprises: reading out two of the contacts while biasing two other contacts of the at least 4 contacts thereby obtaining a readout signal; switching biasing and readout contacts according to a random or pseudo-random sequence of phases, each phase corresponding with a different permutation of biasing and readout contacts selected from the at least 4 contacts of the Hall plate wherein the biasing and readout contacts are selected such that the readout signal is a measure for the magnetic field; processing of the readout signal to obtain a readout of the Hall plate representative for the magnetic field.

15 Claims, 7 Drawing Sheets

RANDOMIZED SPINNING OF HALL PLATES

FIELD OF THE INVENTION

The present invention relates in general to the field of sensors, and more in particular to methods and devices for reading out a Hall plate.

BACKGROUND OF THE INVENTION

Hall elements for measuring a magnetic field are very well known, and are used inter alia in current sensors, or in angular position sensors, where a magnetic field (e.g. generated by a permanent magnet) is measured at several locations of the sensor device, and is converted into an angular position, as described for example in WO9854547 (published in 1998).

The present invention is concerned with obtaining accurate measurements of a magnetic field from the Hall plates. One problem with Hall plates is that an offset is measured even in the absence of a magnetic field. Prior art solutions address this problem for example by a technique known as "spinning" or "current spinning".

In the current spinning technique, the function of Hall plate nodes (for biasing and readout) are changed in a systematic and highly repetitive way to separate the offsets from the useful magnetic signal. With these repetitive schemes, current spinning provides a form of "chopping" adapted for use in Hall sensors. Because of transients that occur when changing the spinning phase, the maximum spinning rate fs (defined as the reciprocal of the duration of one spinning phase) is constrained. Consequently, the achievable chopping frequency (i.e. the separation in frequency of the offset from the useful signal) is also constrained. "Chopping" only separates the offsets from the useful signals, and hence in practice the unwanted offset components still have to be suppressed. This is classically done by frequency-selective removal of the offset-related components by means of filtering. In order to avoid that useful input signals are removed, this filtering needs to be done outside the frequency band occupied by the useful signals. Consequently, in practice, the useful bandwidth of the sensor signal is limited by the applied chopping frequency. Therefore, a constraint on the chopping frequency (which itself originates from a constraint on the spinning rate) translates into a constraint on the maximum sensor bandwidth.

The least residual offset is obtained when averaging four distinct phases. Such an averaging reduces the overall sensor bandwidth. When in need of high bandwidth, 4-phase spinning while averaging over only two sequential phases may be considered. However, this leads to a parasitic "half-chop-rate" tone which as the name implies is located at half of the chopping frequency. Also here, any form of filtering used for removing the "half-chop-rate" tone will also eliminate useful signals near the half-chop-rate frequency. The half-chop-rate frequency therefore marks in practice the end of the useful sensor bandwidth. Even when this "half-chop-rate" tone would be tolerated to lie inside the sensor bandwidth, it typically has a significant impact on the dynamic range.

Hall signals are very weak, and require significant amplification (e.g. a gain of 1000). A low noise (instrumentation) amplifier (LNA) may be integrated in the readout device. The LNA ideally has a bandwidth comparable to the sensor bandwidth. LNAs with a near-optimal bandwidth extending up to the chopping frequency and possibly having a high gain are known in the field, e.g. disclosed in US2017/0207761A1. When using such an LNA for Hall readout with 4-phase spinning, the above described half-chop-rate tone falls halfway of the LNA bandwidth. Since the realized gain of the LNA may be large (e.g. 1000), the half-chop-rate tone may need to be removed, or at least significantly suppressed. It is not obvious how to do this, especially when there may be an unknown input signal at the very same frequency as the half-chop-rate tone.

One approach to avoid the above problems is to apply only two-phase spinning. This however results in a larger residual offset, in magnitude comparable to the half-rate tone amplitude. So, a very similar parasitic signal is present, only at DC instead of at the half-rate frequency. As a result, similar problems arise w.r.t. the dynamic range when amplifying the signals. Furthermore, it is not clear if the larger residual offset (now at DC) can be calibrated effectively in an "on-line" way, that is in the presence of unknown external magnetic fields.

There is therefore room for improvement in methods and readout devices for reading out Hall plates.

SUMMARY OF THE INVENTION

It is an object of embodiments of the present invention to provide a good method and readout device for reading out Hall plates.

The above objective is accomplished by a method and device according to the present invention.

In a first aspect embodiments of the present invention relate to a method of reading out a Hall plate which comprises at least 4 contacts. The method comprises:

reading out two of the contacts while biasing two other contacts of the at least 4 contacts thereby obtaining a readout signal, switching biasing and readout contacts according to a random or pseudo-random sequence of phases, each phase corresponding with a different permutation of biasing and readout contacts selected from the at least 4 contacts of the Hall plate wherein the biasing and readout contacts are selected such that the readout signal is a measure for the magnetic field, processing of the readout signal to obtain a readout of the Hall plate representative for the magnetic field.

It is an advantage of embodiments of the present invention that the processed readout signal has a reduced dependency on the plurality of offset contributions compared to the readout signal of a system which does not comprise the randomized spinning. These offset contributions are inherently present when biasing one pair of contacts of a Hall sensor and measuring a signal from the other pair of contacts.

It is moreover advantageous that the bandwidth of the Hall readout can be increased, or equivalently that the latency of the readout can be reduced compared to prior art phase spinning based methods. Increasing the bandwidth may for example be advantageous in current sensors, whereas reducing the readout latency may be advantageous in high speed angular sensors.

In embodiments of the present invention the processing of the readout signal comprises applying at least one offset feedback loop on the readout signal.

It is an advantage that offset feedback is applied, thus allowing to increase the gain when reading out (e.g. by means of an LNA) without causing saturation due to offset-related terms.

In embodiments of the present invention at least one offset feedback loop comprises a chopper operated in a randomized way dependent on the random or pseudo-random sequence of phases.

It is an advantage of embodiments of the present invention that phase dependent offsets can be reduced by applying a random or pseudo-random sequence of phases, and by applying at least one offset feedback loop on the readout signal.

In embodiments of the present invention the random sequence of phases is generated by a combination of a first and a second sequence wherein at least one of the sequences is a random or pseudo-random sequence and wherein the phases are grouped and the first sequence controls which group is selected, while the second sequence influences the choice between phases within the group.

The first sequence may for example be random while the second is not or the second sequence may be random while the first is not. One combination may be preferred over the other because of the magnitude of the offset terms. In embodiments of the present invention the first and second sequences may for example be bipolar sequences. The first sequence or the second sequence may for example be an alternating sequence of +1 and −1.

In embodiments of the present invention the at least one random or pseudo-random sequence is a pseudo-noise sequence. For this and the following exemplary embodiments this may be the first and/or the second sequence.

The at least one random or pseudo-random sequence may for example be generated by means of a linear-feedback shift register.

In embodiments of the present invention the at least one random or pseudo-random sequence has a spectral density with a predefined spectral shape.

In embodiments of the present invention the at least one random or pseudo-random sequence has a high-pass spectral density.

In embodiments of the present invention the at least one random or pseudo-random sequence has a band-pass spectral density.

In embodiments of the present invention the at least one random or pseudo-random sequence is generated by means of a digital-domain Sigma-Delta modulator.

In embodiments of the present invention at least one sequence is an alternating sequence. This may for example be the first sequence.

In a second aspect embodiments of the present invention relate to a readout device for reading out a Hall sensor comprising at least four contacts. The device comprises:

a biasing circuit connectable to a pair of the contacts and configured for forcing a current from one connected contact to the other connected contact, a readout circuit connectable to a pair of the contacts and configured for obtaining a readout signal from the connected contact pair, a switch matrix configured for connecting the biasing circuit to a pair of the contacts of the Hall sensor and for connecting the readout circuit to another pair of the contacts of the Hall sensor, a controller configured for controlling the switching matrix according to a random or pseudo-random sequence of phases, each phase corresponding with a different permutation of biasing and readout contacts selected from the at least 4 contacts of the Hall plate wherein the biasing and readout contacts are selected such that the readout signal is a measure for the magnetic field, a signal processing module connected with the readout circuit and configured to process the readout signal to obtain a readout of the Hall plate representative for the magnetic field.

In embodiments of the present invention the signal processing module comprises at least one offset feedback loop.

In embodiments of the present invention the controller is configured for obtaining the random sequence of phases by combining a first and a second sequence wherein at least one of these sequences is a random or pseudo-random sequence and wherein the phases are grouped and the first sequence controls which group is selected, while the second sequence influences the choice between phases within the group.

In embodiments of the present invention a first offset feedback loop is configured for operating at a frequency of the first sequence, and a second offset feedback loop is configured for operating using the second sequence as chopper signal and a third offset feedback loop is configured for operating using a product of the first and the second sequence as chopper signal.

In embodiments of the present invention at least one offset feedback loop comprises an integrator.

In embodiments of the present invention the at least one offset feedback loop comprises at least one finite impulse response filter.

In embodiments of the present invention the readout device may be integrated in a magnetic sensor device which also comprises a Hall sensor.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
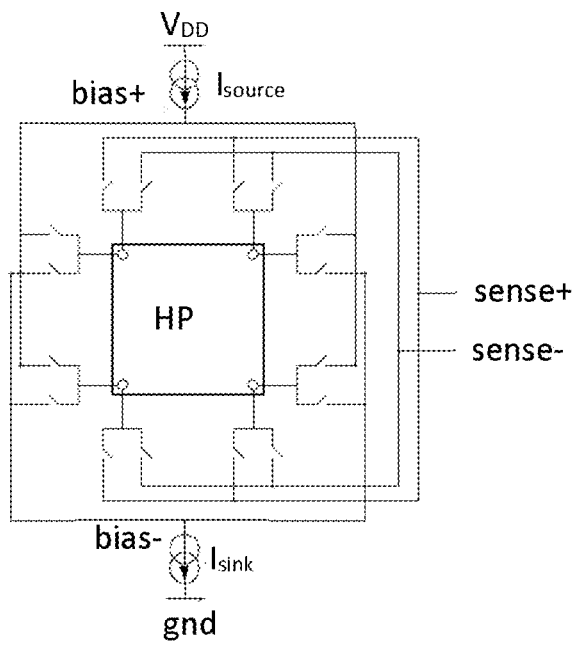
FIG. 1 shows a prior art four contact Hall element.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Hall elements are passive resistive structures and need to conduct a current before an output-signal can be retrieved from them. Where in embodiments of the present invention the term "biasing" is used, this refers to applying a voltage or current to such a structure. Where in embodiments of the present invention the term "readout" is used, this refers to retrieving a sensor signal or a sensor value from such a structure.

In order to better understand and appreciate the present invention, first the classical ways of biasing and reading out a Hall element will be described referring to FIGS. 1 to 3.

A basic Hall element (also referred to as "Hall plate") consists of a conducting material provided with at least four electrical contacts. To make use of the "Hall effect", a current has to flow through the element. A bias current I is supplied via two of the contacts, which will be referred to as the "biasing contacts". The readout signal (e.g. a differential voltage) obtained from two other contacts, referred to as the "readout contacts", is a measure for the magnetic field component Bz (the z-direction is a direction orthogonal to the surface of the Hall element). However, even without a magnetic field an offset may be present in the readout signal.

Current spinning is a general technique for separating the offset from the useful magnetic signal. In this, the contacts of a Hall element are biased and read out in different arrangements. These arrangements are obtained by switching biasing and readout to particular contacts. An embodiment of the technique, applicable to a four-contact Hall element (HE), is shown in FIG. 1.

In this example, each HE contact can be connected to a bias source that delivers current to the HE (through the bias+ node), or to a current sink (through the bias− node). In the figure, two current sources are shown that define the sourcing and sinking currents, but these can also be voltage sources, and a single voltage or current source is also sufficient.

Figure 2:
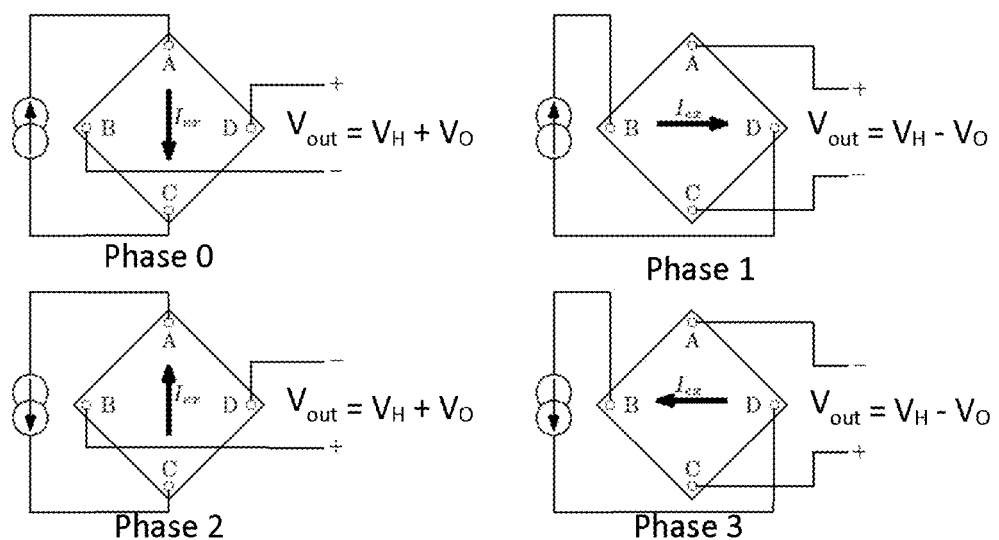
FIG. 2 shows a particular prior art phase spinning scheme.

For a Hall readout, the biasing contacts A, C and readout contacts B, D, illustrated in FIG. 2, alternate with each other. If an excitation current Iex is applied to the biasing contacts A, C, and if an out-of-plane magnetic field Bz is applied to the element, a Hall voltage $V_H$ proportional to the applied magnetic field Bz will appear between the readout contacts B, D; Besides the Hall voltage, also an offset voltage will be present between the readout contacts.

There are two common approaches for realizing the biasing current. One approach uses a current source, in which case the nominal value of the applied current I is known (I=Iex). The other approach uses a voltage source, in which case the nominal voltage over the plate is known (V=Vex).

Each node can also be connected to a positive sensing node (sense+) or to a negative node (sense−) using a switching matrix comprising a plurality of switches. Depending on the particular spinning scheme that is utilized, some of these switches may not be required. A particular spinning scheme consists of sequencing in a repetitive way through the four phases illustrated in FIG. 2.

In the example of FIG. 2 the following phases are applied sequentially:
Phase 0, biasing contacts AC, readout contacts DB, resulting in an output voltage roughly modeled as $V_{out}=V_H+V_O$;
Phase 1, biasing contacts BD, readout contacts AC, resulting in an output voltage roughly modeled as $V_{out}=V_H-V_O$;
Phase 2, biasing contacts CA, readout contacts BD, resulting in an output voltage roughly modeled as $V_{out}=V_H+V_O$;
Phase 3, biasing contacts DB, readout contacts CA, resulting in an output voltage roughly modeled as $V_{out}=V_H-V_O$.

Herein $V_H$ is the Hall voltage, $V_O$ models the offset voltage, and $V_{out}$ is the output voltage. Note that phases 0 and 2 may be considered chopping-equivalent readouts: one can be obtained from the other by changing the sign of both the biasing and the readout. The same applies to phases 1 and 3.

The Hall element output signal may be represented as:

$$V_{out}(p) = V_H + (-1)^p V_O \quad (1)$$

In this, p corresponds to the phase number (0, 1, 2 or 3). This particular spinning scheme, when applied repetitively, results in up-conversion of the Hall plate offset to a high frequency.

Figure 3:
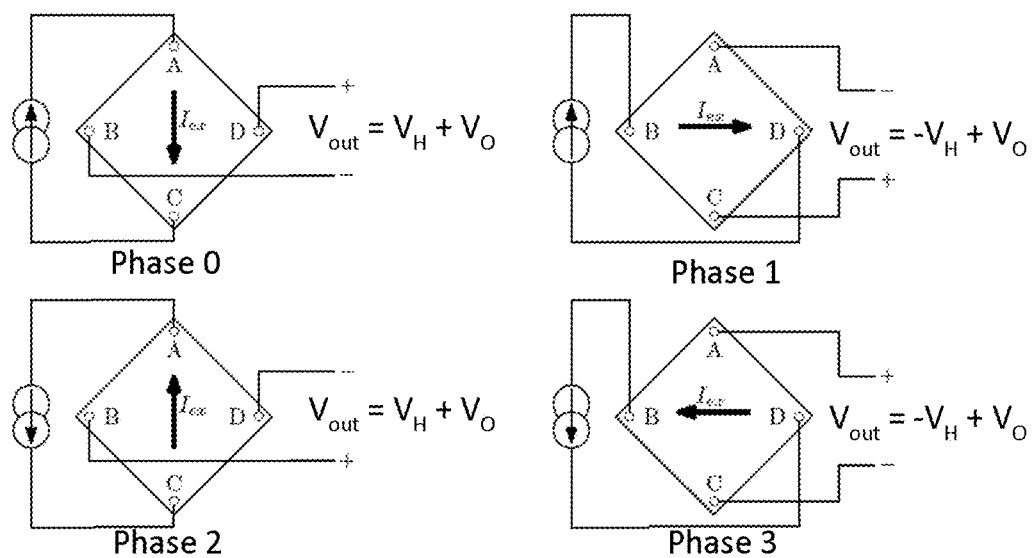
FIG. 3 shows an alternative prior art phase spinning scheme.

Another prior art spinning scheme illustrated in FIG. 3 consists of sequencing in a repetitive way through the following four phases:
Phase 0, biasing contacts AC, readout contacts DB, resulting in an output voltage roughly modeled as $V_{out}=V_H+V_O$;
Phase 1, biasing contacts BD, readout contacts CA, resulting in an output voltage roughly modeled as $V_{out}=-V_H+V_O$;
Phase 2, biasing contacts CA, readout contacts BD, resulting in an output voltage roughly modeled as $V_{out}=V_H+V_O$;
Phase 3, biasing contacts DB, readout contacts AC, resulting in an output voltage roughly modeled as $V_{out}=-V_H+V_O$.

The Hall element output signal may in this case, for instance, be represented as (again roughly modeled):

$$V'_{out}(p) = (-1)^p V_H + V_O \quad (2)$$

This particular spinning scheme, when applied repetitively, therefore results in up-conversion of the useful Hall signal related to the magnetic-field. In both spinning schemes each phase corresponds with a different permutation of biasing and readout contacts. Although in this and the following equations a Hall plate with 4 contacts is assumed the equations can be generalized to Hall plates with a higher number of contacts.

An advantage of this particular spinning scheme is that the offset $V_O$ in (2) may combine with an offset of a front-end circuit that follows thereafter, both offsets being essentially at DC. Therefore, the effect of offset of the front-end circuits can be taken into account by considering the $V_O$ to be the combination of a Hall-element offset plus an input-referred offset of the front-end circuit. Therefore, also the front-end related offsets can be handled by the same spinning/chopping scheme applied for readout of the Hall elements. Prior art approaches therefore often apply this second spinning scheme. However, because now the sign of the magnetic signal may be altered, a demodulation needs to be done further on, typically after amplification of the weak HE output signals has taken place. The amplified and demodulated signal $A \cdot V'_{out}(p) \cdot (-1)^p$ with $V'_{out}(p)$ according to (2) obtained with the second spinning scheme can be easily shown to be of the same form as $A \cdot V_{out}(p)$ with $V_{out}(p)$ according to (1), i.e. obtained using the first spinning scheme. For reasons of clarity, the gain factor is not explicitly mentioned in what follows. Any simple scale factor can be absorbed in the definitions of the entities $V_H$, $V_O$, and $V_X$, $V_Y$ (defined hereafter).

As a result, the demodulated signal may be formally defined as $V_{out}(p)=(-1)^P \cdot V'_{out}(p)$. With this definition and (2), also for this case the expression (1) is obtained, but now it is implicitly understood that $V_O$ may comprise an additional offset contribution from the front-end. In what follows, (1) may be used as the outcome of the first spinning scheme, or as the result of applying the second spinning scheme subsequently followed by demodulation.

In the model (1) $V_O$ has been introduced as a constant representative for the HE offset, which is only valid as a rough approximation. A more accurate offset model is explained below. It is known in the art that the offset depends to some extend on the spinning phase, e.g. due to nonlinearity of the sensing element. There are therefore four offset values, one for each phase: $V_O^{(0)}$, $V_O^{(1)}$, $V_O^{(2)}$, $V_O^{(3)}$. A mathematically equivalent model for the offset as a function of the phase p can be shown to be:

$$V_O^{(p)} = V_O + d(p)V_X + c(p)d(p)V_Y + c(p)V_Z \quad (3)$$

with $$c(p) = (-1)^p \quad d(p) = \sqrt{2}\cos\left(n\frac{\pi}{2} - \frac{\pi}{4}\right) \quad (4)$$

and the model values $V_O$, $V_X$, $V_Y$, and $V_Z$ defined as:

$$V_O = \frac{V_O^{(0)} + V_O^{(1)} + V_O^{(2)} + V_O^{(3)}}{4} \quad (5)$$

$$V_X = \frac{V_O^{(0)} + V_O^{(1)} - V_O^{(2)} - V_O^{(3)}}{4}$$

$$V_Y = \frac{V_O^{(0)} - V_O^{(1)} - V_O^{(2)} + V_O^{(3)}}{4}$$

$$V_Z = \frac{V_O^{(0)} - V_O^{(1)} + V_O^{(2)} - V_O^{(3)}}{4}$$

The functions c, d and c·d depend on the phase p, assume only the values +1 and −1 and can be represented by the following table.

| p | 0 | 1 | 2 | 3 |
|---|---|---|---|---|
| c | +1 | −1 | +1 | −1 |
| d | +1 | +1 | −1 | −1 |
| c·d | +1 | −1 | −1 | +1 |

Eqn. (5) demonstrates that the model parameters $V_O$, $V_X$, $V_Y$, and $V_Z$ are simple linear combinations of offset values occurring in different spinning phases. The term $V_O$, which was included in the previous simpler model, corresponds in the more accurate model to the average rough offset. The term $V_Z$ corresponds to the residual offset after four-phase spinning.

The HE signal obtained by readout with phase p is then given by:

$$V_{out}^{(p)} = V_H + V_Z + c(p)V_O + c(p)d(p)V_X + d(p)V_Y \quad (7)$$

This equation shows that, whatever the spinning scheme, the residual 4-phase offset $V_Z$ cannot be distinguished from the useful Hall signal $V_H$. The sign of the other terms, those related to $V_O$, $V_X$ and $V_Y$, can be affected by the choice of the spinning phase. By changing the phase p as a function of time, the coefficient c(p), d(p) and c(p)d(p) may alternate between +1 and −1. For instance, when going repetitively through the phases 0 to 3, the sequence of signs as they appear in the table displayed in (6) is obtained. In this case, c is a chopping signal that alternates between +1 and −1 at the highest possible frequency, and both d and c·d are regular chopping signals alternating at half of this rate. In general, the average rough offset $V_O$ is an order of magnitude larger compared to $V_X$ and $V_Y$. It is therefore advantageous to shift the $V_O$ component using the chopping signal with the highest chopping frequency. $V_X$ and $V_Y$ result in smaller tones at half of this frequency. The model parameters $V_O$, $V_X$, $V_Y$, and $V_Z$ can also be determined from the Hall element output signals:

$$V_O = \frac{V_{out}^{(0)} - V_{out}^{(1)} + V_{out}^{(2)} - V_{out}^{(3)}}{4} \quad (8)$$

$$V_X = \frac{V_{out}^{(0)} - V_{out}^{(1)} - V_{out}^{(2)} + V_{out}^{(3)}}{4}$$

$$V_Y = \frac{V_{out}^{(0)} + V_{out}^{(1)} - V_{out}^{(2)} - V_{out}^{(3)}}{4}$$

$$V_Z = \frac{V_{out}^{(0)} + V_{out}^{(1)} + V_{out}^{(2)} + V_{out}^{(3)}}{4} - V_H$$

An important assumption for the validity of the above expressions is that the Hall magnetic signal remains constant during the four phases. The first three expressions in (8) show that in order to determine $V_O$, $V_X$ and $V_Y$, an unknown magnetic field may be present. This allows to set up a feedback loop that estimates the current values $V_O$, $V_X$ and $V_Y$, or more precisely what is left of it after compensation, based on the $V_{out}$ signals obtained during the different phases, and based on these estimates adapt or set a compensation to null the three offset terms (associated with $V_O$, $V_X$ and $V_Y$). In contrast, $V_Z$ requires precise knowledge of the Hall magnetic signal, and hence an accurate measurement may require a magnetically shielded (zero-Gauss) chamber to be used.

For some applications, Hall-based current sensors with high bandwidth are required. Preferably, the sensor bandwidth of these Hall sensors extends up to the (highest) chopping frequency, with some margin to be able to remove up-converted flicker noise (e.g. from the LNA). An example of such a high-bandwidth system is the "low-noise amplifier circuit" as disclosed in US2017/0207761A1. However, when such low-noise amplifier circuits are used for readout of Hall elements with four-phase spinning, a parasitic tone at half the chopping frequency emerges.

Prior art methods like for example U.S. Pat. No. 9,685,967 use four-phase spinning (e.g. the second spinning scheme) combined with three ripple reduction loops to combat all three independent offset components generated by four-phase spinning. This approach results in a sharp notch appearing in the amplifier transfer located at half the chopping-rate. This notch can be seen in FIG. 10. It is an object of embodiments of the present invention to provide a method wherein this notch is avoided.

In prior art systems for example the following readout combinations may be determined (re-written in the notations according to the present invention disclosure and shown on the left-hand side of the equations):

$$\frac{V_{out}^{(0)} - V_{out}^{(1)}}{2} = V_O + V_X \quad (9)$$

$$\frac{V_{out}^{(2)} - V_{out}^{(3)}}{2} = V_O - V_X$$

$$\frac{V_{out}^{(0)} + V_{out}^{(1)} - V_{out}^{(2)} - V_{out}^{(3)}}{4} = V_Y$$

Assuming that the magnetic field is constant over the four phases, the above expressions reduce to what is shown on the right-hand side. The above combinations are integrated in the ripple reduction loops for the purpose of driving these values to zero. The integrator outputs are used for generating a compensating signal that affects the net remaining $V_O$, $V_X$, and $V_Y$. The three ripple reduction loops therefore succeed in jointly zeroing the $V_O$, $V_X$, and $V_Y$ terms. However, the first two signals to be nulled in (9) are different from the combinations proposed in (8). It is noticed by the inventors that in this prior art method $V_O$, and $V_X$ are not handled in an independent way, but rather as combinations $V_0 \pm V_X$. Since $V_0 \pm V_X$ is typically large compared to $V_X$, the first two loops need to have sufficient dynamic range to handle these larger terms. This is different from a method according to embodiments of the present invention as will be explained in a following section, wherein only one feedback path needs a large range to cancel $V_O$, while the two other feedback paths are able to handle the smaller $V_X$ and $V_Y$.

Prior art systems exist having repetitive four-phase spinning, and up to three ripple reduction loops that remove signals at the chopping frequency, and at half of this frequency. Unfortunately, the system with ripple reduction loops also reacts to the input signal. More particularly, when the useful input signal related to the magnetic field comprises frequency components at the chopping and/or half chopping rate, these are removed (blocked) by the ripple reduction loops. In most cases, it is undesirable that some frequencies lying within the signal bandwidth do not appear at the output, even when the notch bandwidth is very small. In such cases, the useful bandwidth of the HE magnetic sensor system is in practice limited to the lowest notch frequency, i.e. at half of the normal chopping rate.

In a first aspect embodiments of the present invention relate to a method of reading out a Hall plate which comprises at least 4 contacts. A readout signal can be obtained by reading out two of the contacts of the Hall plate while biasing two other contacts of the Hall plate.

Reading out of the contacts may thereby imply continuously monitoring the signal at the contacts over the full spinning interval. The spinning interval refers to the period during which the biasing and readout contacts are not switched.

Alternatively, it may imply monitoring the signal at the contacts over a fraction of the spinning interval, e.g. excluding some transition time at the beginning of the spinning interval to allow settling of the Hall element after having switched the bias and/or readout contacts.

Alternatively, it may imply monitoring the signal at the contacts at one or more discrete instants within the spinning interval.

Figure 4:
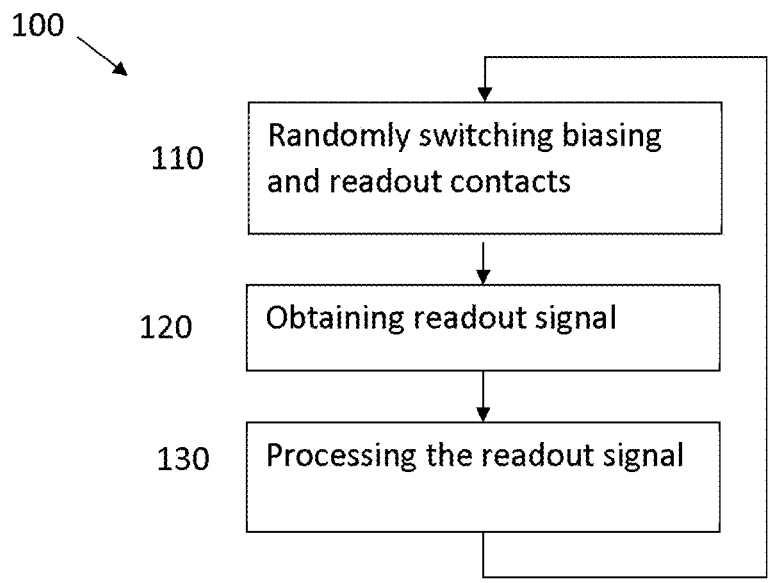
FIG. 4 shows different steps of a method in accordance with embodiments of the present invention.

Different steps of such a method are illustrated in FIG. 4.

The method comprises switching 110 biasing and readout contacts according to a random or pseudo-random sequence of phases, each phase corresponding with a different combination/permutation of biasing and readout contacts selected from the at least 4 contacts of the Hall plate.

After switching 110 the biasing and the readout contacts, the readout contacts are read out 120 while biasing the biasing contacts. Thereby a readout signal is obtained.

The method moreover comprises processing of the readout signal to obtain a readout of the Hall plate which is representative for the magnetic field. It is thereby advantageous that a reduced dependency on the plurality of offset contributions can be obtained because of the random or pseudo-random sequence of phases.

The processing 130 of the readout signal moreover may comprise applying at least one offset feedback loop on the readout signal.

It is an advantage of embodiments of the present invention that with randomized spinning schemes (instead of a regular spinning scheme) notches due to the ripple reduction loops can be avoided. Methods and readout devices according to embodiments of the present invention may therefore provide a larger effective bandwidth.

In embodiments of the present invention the random sequence of phases is generated by a combination of a first and a second bipolar sequence wherein at least the second bipolar sequence is a random or pseudo-random bipolar sequence. In embodiments of the present invention the phases are grouped and the first sequence controls which group is selected, while the second sequence influences the choice between phases within the group. The first group may for example comprise phases 0 and 2 and the second group comprises phases 1 and 3.

An example hereof is illustrated in the paragraphs below.

The random or pseudo-random sequence of spinning phases may for example be obtained starting from the chopping functions c, d, and c·d, which are described above. In a method according to the present invention, for each spinning interval a +1 or −1 may for example be independently assigned to two of the three chopping functions c, d, and c·d and from this a spinning phase may be determined to be used for the considered spinning interval. The assigned chopping functions are in that case corresponding with the first and the second bipolar sequence. In the example below the independent choice is made for $c \in \{-1, +1\}$ and $d \in \{-1, +1\}$. The invention is, however, not limited thereto. Starting from c and d the phase p is uniquely determined as:

$$p = \frac{1-c}{2} + 1 - d \quad (10)$$

In this example c corresponds with the first bipolar sequence and d with the second bipolar sequence. This formula can be easily checked with (6) by going through all cases: c=+1 and d=+1 corresponds to phase p=0, c=−1 and d=+1 corresponds to phase p=1, c=+1 and d=−1 corresponds to phase p=2, and c=−1 and d=−1 corresponds to phase p=3. It can be note from (10) that c determines the use of an even or an odd phase, while d selects between two chopping-equivalent readouts. This provides a basis for working out alternative spinning schemes.

In embodiments of the present invention the chopping signal c, corresponding with the first bipolar sequence, may be retained as alternating between +1 and −1, producing the fastest possible rate (relative to the spinning rate fs). The associated chopping frequency is then fs/2. This way, the expected large tone corresponding to $V_O$ remains translated to the highest possible frequency (relative to the spinning rate being used). Let time be represented by n, indicating the $n^{th}$ time slot in which a readout of the HE is conducted (according to some phase). Then, the above choice for c can be summarized as $c(n)=(-1)^n$. With this, the subsequent readout values can be expressed as:

$$V_{out}(n)=V_H+V_Z+(-1)^n V_O+(-1)^n d(n)V_X+d(n)V_Y \quad (11)$$

with d(n) the value used for the chopping function d within the $n^{th}$ time slot. The $V_O$ term can be removed by classical means based on filtering or a ripple reduction loop operating at the highest chopping frequency. The terms proportional to $V_X$ and $V_Y$, which result in half-chop-rate tones when applying four-phase spinning with a regular scheme, can be spread over many frequencies by assigning to d(n) a random or pseudo-random value of +1 or −1. Of course, this way the power associated with $V_X$ and $V_Y$ is still present but is merely spread over many different frequencies. In embodiments of the present invention an "offset reduction loop" is disclosed which is able to aggregate the spread power associated with $V_X$ and $V_Y$, or what is left over of these error sources after compensation and which can be used to reduce these terms by means of a compensating signal. The same is the case for the $V_0$ term when c is random. Because of the above property, these feedback loops are termed "spread-spectrum offset reduction loops" or "spread-spectrum offset feedback loops".

In embodiments of the present invention the second bipolar sequence (e.g. the sequence d(n)) may be a random or a pseudo-random bipolar sequence (bipolar refers here to having only the values +1 or −1). As is well known in the art, a pseudo-noise (PN) sequence may be generated by means of a linear-feedback shift register (LFSR), which is essentially an N-bit shift register in which at each clock cycle the new bit being shifted into the register is determined by a boolean function of some or all of the registers' bits. The PN sequence generator generates pseudo-random bits, e.g. by selecting one particular bit of the shift register, where this pseudo-random bit may be associated with the binary choice d=+1 or d=−1. For many values of N, maximum length sequences can be found in which the shift register assumes $2^N-1$ distinct states, that is all possible states except one (the all-zero state). Other means for generating random d(n) may be readily derived from nearly any random number generator.

In many cases, the above ways of generating (pseudo)-random bipolar sequences will often lead to signals having a fairly flat spectral density. In some cases, bipolar sequences for which the spectral density has other spectral shapes may be preferable. Such bipolar sequences may for example be applied to avoid generating extra noise in some preferred frequency range.

The generation of spectrally shaped random bipolar sequences can be accomplished by means of a digital-domain Sigma-Delta modulator (SDM).

Figure 5:
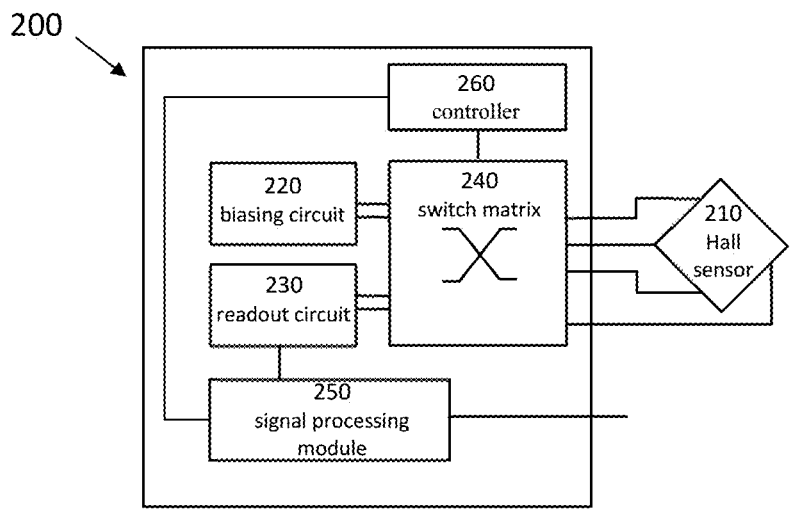
FIG. 5 shows a schematic drawing of a readout device, for reading out a Hall sensor, in accordance with embodiments of the present invention.

A schematic drawing of a readout device 200, for reading out a Hall sensor 210, in accordance with a second aspect of the present invention is illustrated in FIG. 5. The figure shows a biasing circuit 220 connectable to a pair of the contacts of the Hall sensor and configured for forcing a current from one connected contact to the other connected contact.

The figure furthermore shows a readout circuit 230 connectable to a pair of the contacts of the Hall sensor and configured for obtaining a readout signal from the connected contact pair.

The readout device moreover comprises a switch matrix 240 configured for connecting the biasing circuit 210 to a pair of the contacts of the Hall sensor and for connecting the readout circuit 220 to another pair of the contacts of the Hall sensor.

A controller 260 is configured for controlling the switching matrix according to a random or pseudo-random sequence of phases, each phase corresponding with a different combination of biasing and readout contacts selected from the at least 4 contacts of the Hall plate.

The signal processing module 250 of FIG. 5 is connected with the readout circuit 230 (for receiving the readout signal) and with the controller 260 (for receiving the random or pseudo-random sequence of phases) and is configured to process the readout signal to obtain a readout of the Hall plate representative for the magnetic field.

In embodiments of the present invention the signal processing module may comprise one or more offset feedback loops.

Figure 6:
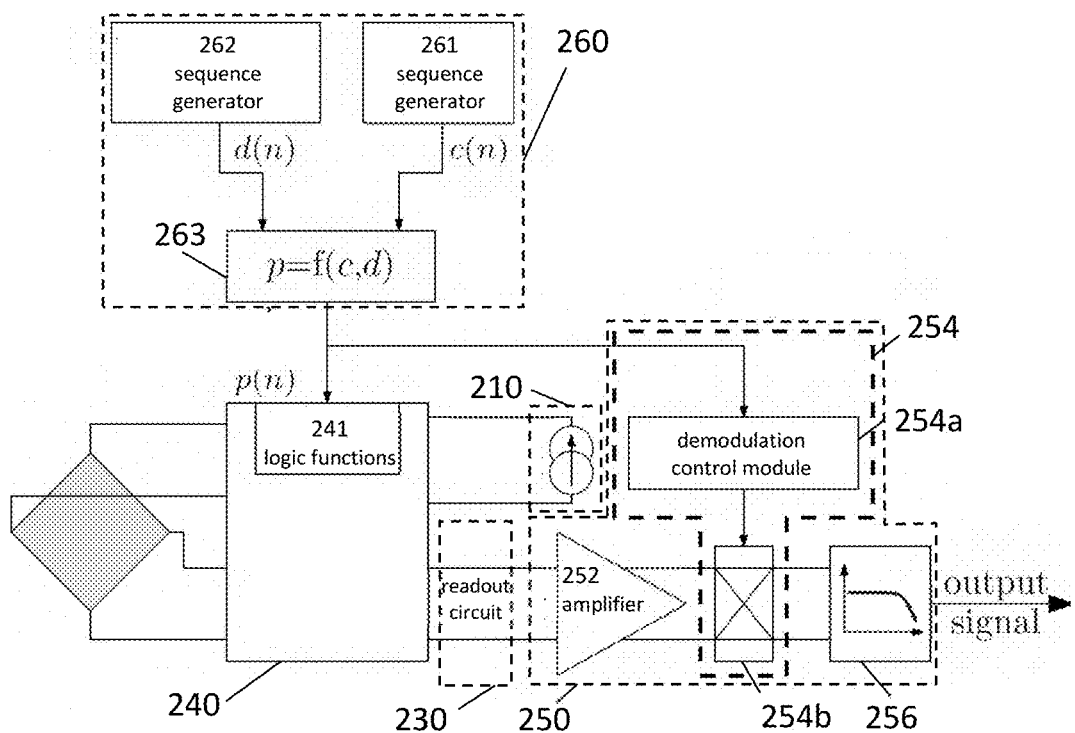
FIG. 6 shows a schematic drawing of a readout device comprising a processing module without offset feedback loop, in accordance with embodiments of the present invention.

FIG. 6 provides an embodiment with randomized spinning. In this figure, n is indicative of the time slot in which a random spinning phase is applied.

For each time slot n, two values c(n) and d(n) are generated, forming together two sequences of values. The first sequence c(·) is generated by a periodic sequence generator 261, and preferably changes at a high frequency when going through successive time slots, e.g. continuously alternating between two output values (e.g. +1 and −1). The second sequence d(·) is generated by a pseudo-random sequence generator 262, for example a maximum-length pseudo-noise sequence generator with one bit of the linear feedback shift-register being used as pseudo-random output bit. The second sequence d(·) may also be generated by a noise-shaping system, e.g. according to FIG. 7.

The values c(n) and d(n) are then translated into a spinning phase by module 263, e.g. according to a function f as defined by (10). This leads to a random spinning phase p(n) being selected for each time slot n. This random phase is used to define the interconnection of the Hall plate with the biasing source 210 and the sensing (readout) circuit 230. An actual implementation may be using a 4×4 switch array 240, e.g. as shown in FIG. 1. The selection signals for operating the multitude of switches in the switch array can be implemented as Boolean logic functions 241 having as input the phase number p to be used for the measurements in the $n^{th}$ time slot. These Boolean functions can be designed to implement a particular set of spinning phases, such as for instance the spinning phases shown in FIG. 2, or the spinning phases as shown in FIG. 3.

The sensed readout signal collected by the switch array 240 is connected through the readout circuit 230 with an amplifier 252. As explained before, depending on the particular set of phases used, an additional chopper 254 may be needed (for demodulating the magnetic signal), e.g. a demodulator 254b placed after the amplifier 252, with the chopper state being dependent on the spinning phase p(n) used for readout of the Hall plate using a demodulation control module 254a. Because this functionality is not always needed, e.g. when using the spinning phases as defined in FIG. 2, the chopper 254 is optional. The chopper is not needed when using the phases as defined in FIG. 2, even if the phases are randomly selected from this scheme. This is because, as indicated on the figure, VH has always a plus sign in front. This means that only the offset contributions are randomized. The sign of the offset is mainly determined by the parity (even/odd) of the phase number, while some smaller offset variations occur because the exact offset magnitude also depends on the phase number. When using the spinning phases as defined in FIG. 3, the demodulation function $(-1)^{p(n)}$ or c(n) may be used.

The output of the demodulator 254 (or when it is absent, the output of the low-noise amplifier 252) can be modeled by eqn. (11). From this equation, we can see that the offset component associated with $V_O$ is up-converted with a fixed chopping frequency, while the other offset components associated with $V_X$ and $V_Y$ are being randomly spread in frequency and hence appear as noise. This exemplary embodiment comprises a filter 256 to reduce the unwanted signals associated with the offset and delivering an output signal representative for the magnetic field. The tone at the chopping frequency due to $V_O$ can be suppressed in the traditional way, e.g. by lowpass filtering, and/or adding a notch filter operating at the tone frequency, etc. However, filtering may also be applied for reducing the contribution of the randomly spread errors associated with $V_X$ and $V_Y$, leading to a magnetic output signal which is less disturbed by the various offset components. It may be advantageous to shape the spectrum of the sequence d(·), e.g. according to a method as presented when explaining FIG. 7, such that the extra noise is pushed into frequency bands which are more efficiently removed by the filter.

It is understood that embodiments of the present invention may comprise many more functional blocks which do not alter the functional behavior of the embodiment as described here, such as (but not limited to) extra amplifiers, extra filter(s), sample and hold circuit(s), analog-to-digital converter(s), means for offset and stress compensation, etc.

Figure 7:
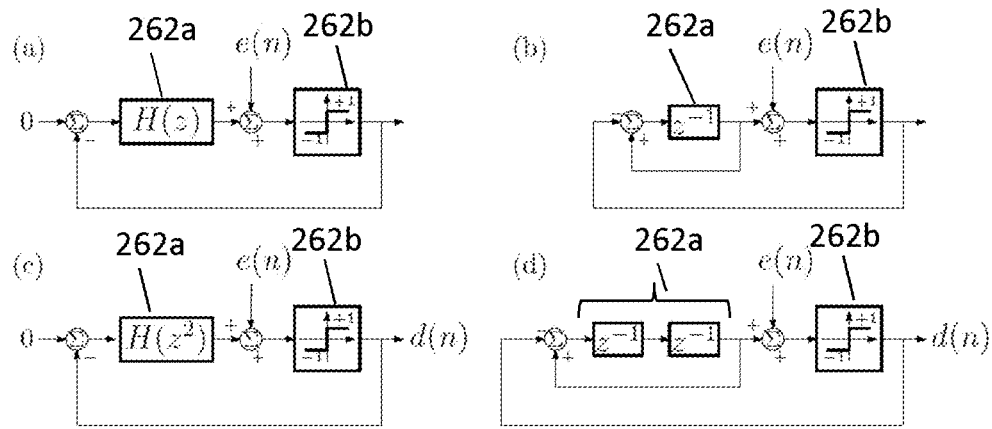
FIG. 7 shows possible implementations of a part of the controller adapted for generating the second bipolar sequence in accordance with embodiments of the present invention.

FIG. 7 shows possible implementations of a part of the controller 260 adapted for generating the second bipolar sequence. In these examples the second bipolar sequence is generated by means of a digital-domain Sigma-Delta modulator (SDM). In essence, the SDMs of FIG. 7 are feedback loops comprising a digital loop filter 262a and a one-bit quantizer 262b. The quantizer essentially determines the sign of its input, and provides this as an output of the SDM. This output is therefore automatically bipolar. A fairly general SDM is shown in (a), having a loop filter H(z) typically comprising one or more digital integrators (accumulators). The order of the SDM corresponds to the number of integrators in the loop filter 262a. A simple first-order example is shown in (b). In order to sufficiently randomize the quantization error, a dither signal e(n) may be added. Such a dither signal e(n) can for instance be derived from a PN sequence described above, with an appropriate scale factor (to avoid overloading the quantizer). Let D(z) denote the Z-transform of the sequence d(n). Because the input of the SDM is taken identical zero, the output of the SDM can be shown to be:

$$D(z) = \frac{Q(z)}{1 + H(z)} \qquad (12)$$

In this, Q(z) represents the quantization noise introduced by the dithered quantizer, which is assumed to be approximately white. Because H(z) is by design large at low frequencies due to incorporation of integrators in H(z), the above equation shows that D(z) has a high-pass characteristic. Hence, the obtained bipolar output d(n) has a high-pass spectral density. As a result, the last term in (11) will introduce shaped noise that does not significantly affect the low frequencies. Some applications may take advantage of this noise-shaping property, for instance when low-pass filtering the sensor signal, thus effectively removing noise at higher frequencies. Unfortunately, the Z-transform of the sequence c(n)d(n) is D(−z), and hence the power spectral density of d(n) and c(n)d(n) are mirror images of each other (mirrored around the "half-chop-rate" frequency fs/4). This means that when d(n) has a high-pass spectral density, then c(n)d(n) will have a low-pass characteristic, and hence there will be noise at low frequencies coming from the second last term in (11). To avoid this, it makes sense to aim for a band-pass spectral density of d(n), preferably one which is symmetric around fs/4. This way, both terms will have similar band-pass spectral densities, largely avoiding increase in noise (due to nonzero $V_X$ and $V_Y$) at low frequencies. One possibility for obtaining the band-pass shaping is to replace H(z) by H($z^2$), thus leading to the embodiment (c), which for the case of a single integrator SDM leads to (d). The transformation z'=$z^2$ results in duplication of the low-frequency poles close to z=1 (due to the integrators in H(z)) to corresponding poles close to the Nyquist frequency z=−1. The output of the SDM in the example (c) becomes:

$$D(z) = \frac{Q(z)}{1 + H(z^2)} \qquad (13)$$

Based on the fact that H($z^2$) becomes large both at low frequencies and at high frequencies (near the Nyquist frequency), it is illustrated that D(z) obtains a band-pass shape.

Figure 8:
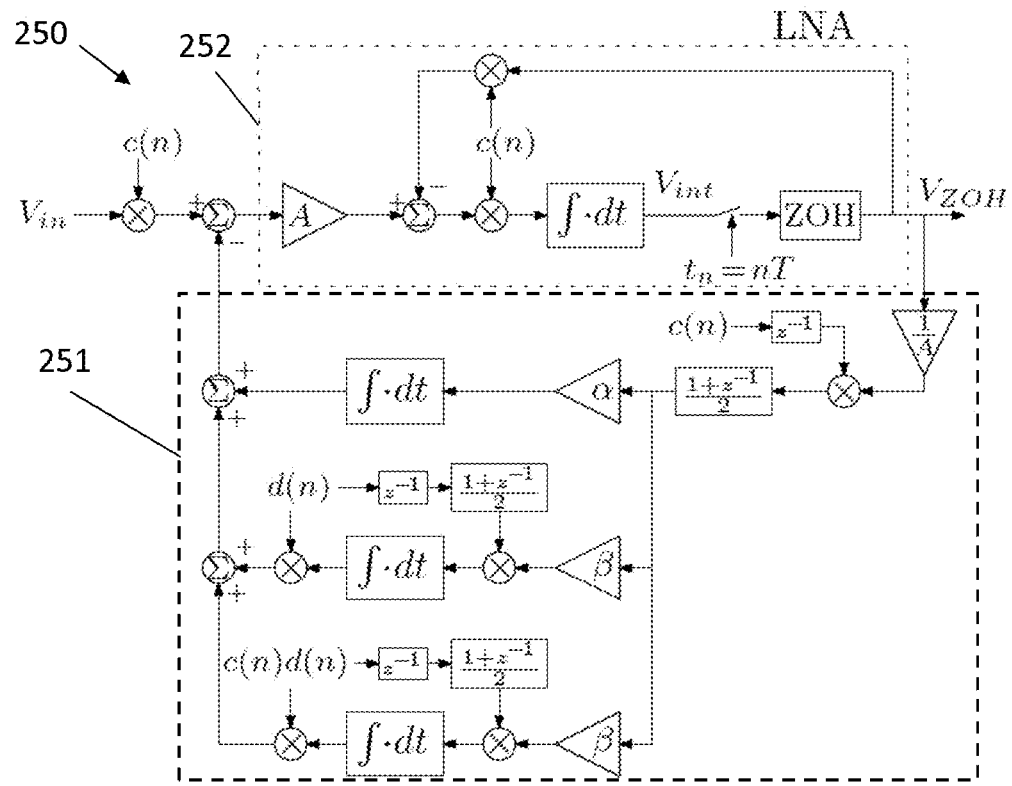
FIG. 8 shows a schematic drawing of an exemplary signal processing module comprising 3 offset feedback loops, in accordance with embodiments of the present invention.

FIG. 8 shows a schematic drawing of an exemplary signal processing module 250, comprising 3 offset feedback loops, in accordance with embodiments of the present invention. The readout circuit is connected with the input of the signal processing module such that the readout signal can be passed to the signal processing module. In this example the signal processing module comprises a low noise amplifier (LNA) 252 and an offset feedback block 251. The LNA may for example be an LNA as disclosed in US2017/0207761A1. This particular LNA architecture consists of a feedback loop in which the input path is a proportionality factor A stronger compared to a feedback path (or equivalently, the feedback path being a proportionality factor I/A weaker compared to the input path). The error between input and feedback path is amplified by means of an integrator. The integrator output is sampled, and held constant during one time slot T=1/fs (zero-order hold ZOH). Particular for this LNA architecture is that the ZOH output is used for providing the feedback signal, which can be shown to suppress noise aliasing. The exemplary LNA also comprises choppers for demodulating signals to baseband prior to integration, and for up-converting the input and feedback signals.

The offset feedback block 251 has a first offset reduction loop operating at the main chopping frequency and, in accordance with embodiments of the present invention, two offset feedback loops operating with chopper signals d(n) and c(n)d(n) are added.

The factors α and β are related to the adaptation rate of the feedback loops. These factors may be used to control the strength of the different offset feedback paths. The adaptation rates may be fixed factors, or they may be controlled, e.g. switched to zero when a feedback loop needs to be disabled. When d(n) is a random or pseudo-random sequence of bipolar values, a spread-spectrum offset feedback loop is obtained.

In the signal processing module 250 illustrated in FIG. 8, finite impulse response (FIR) averaging filters have been introduced as part of the offset feedback block 251. A FIR filter may help in suppressing input-signal related frequencies, e.g. at the lower end of the spectrum, to avoid circulation of these input-related signals into the offset feedback loop(s). Furthermore, FIR averaging filters may also be introduced for averaging the modulation sequences d and c·d, but this is not absolutely required. For the case of the simple averaging filter $$\frac{1 + z^{-1}}{2}$$

operating on a bipolar modulation sequence (e.g. c and/or d), the output is non-zero only when two consecutive values of the chopping functions are equal. This allows to pick up the offset-related signal when it is expected to be the strongest (since the integrator will amplify more when operating on lower frequencies). This can be generalized to embodiments (not shown) in which the offset feedback signal is only changed or adapted when a certain number of identical consecutive values occurs, e.g. four consecutive +1 values or four consecutive −1 values. Note that in the illustrative embodiment of FIG. 8 also various delay elements are introduced to account for the delay of the amplifier.

Since the offsets of Hall plates are static, or drift slowly over time, it is not necessary to continuously apply randomized spinning. Instead, randomized spinning may be applied at startup, or at specific calibration instants, during which the spread-spectrum offset feedback loops adapt the predictions of $V_X$ and $V_Y$ such that the contributions thereof in the output signal are drastically reduced. At that point, the spread-spectrum offset feedback loop may be frozen to its current value by disabling the loop, e.g. by setting the adaptation rate equal to zero. In the non-adaptive phase, random spinning may still be applied, but also regular spinning may be used instead. Offset compensation values obtained from applying the various offset feedback loops may also be stored in some form of memory, to be used later on. Adaptation of the offset compensation values may for instance be done during a factory calibration under various conditions (e.g. as a function of temperature), the outcome of the adaptation being stored in non-volatile memory for use later on.

FIGS. 9 to 13 show simulated output spectra of a system according to FIG. 8. In these figures, the spectrum of the zero-order hold output is shown, which is representative for the samples that the system produces. In these examples the input signal is a chirp, going linearly up in frequency from DC up to fs/2. Even though the input signal is not perfectly flat over the sweep range, and also window effects occur when calculating the spectra, the simulation experiment succeeds in illustrating the various effects that occur. In all simulations, the dependency of the HE offsets on the spinning phase has been included. The sequence c(n) is always chosen as alternating between +1 and −1 at the chopping rate fs/2, and the upper offset feedback path in the feedback block 251 is always activated to remove the average rough offset of the HE.

Figure 9:
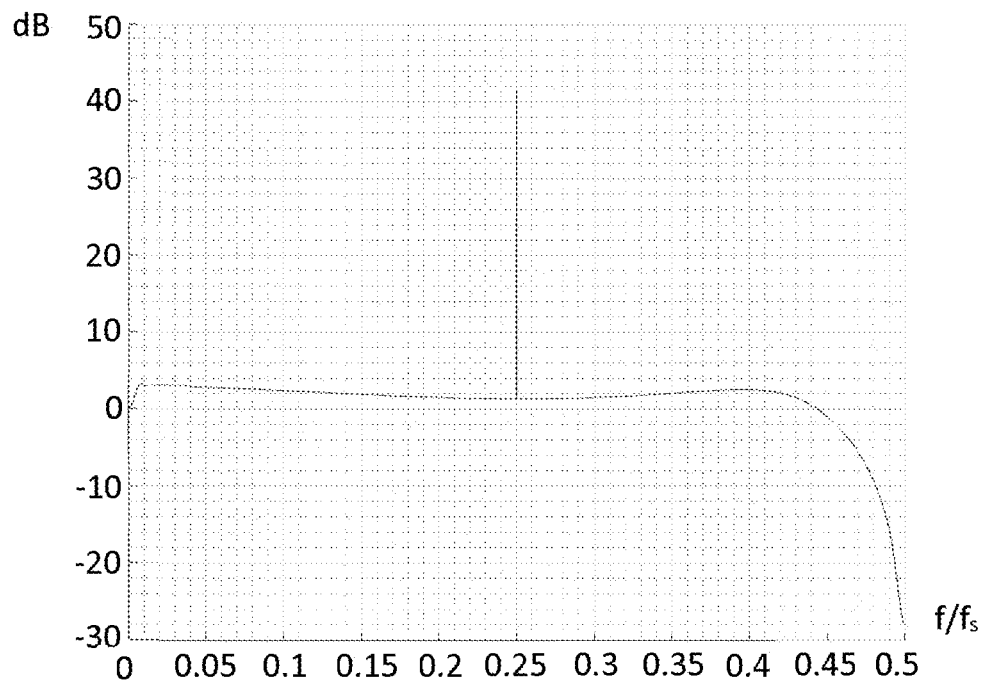
FIG. 9 shows a simulated signal spectrum of an output of a signal processing module if regular spinning is applied and without extra offset feedback paths.
Figure 10:
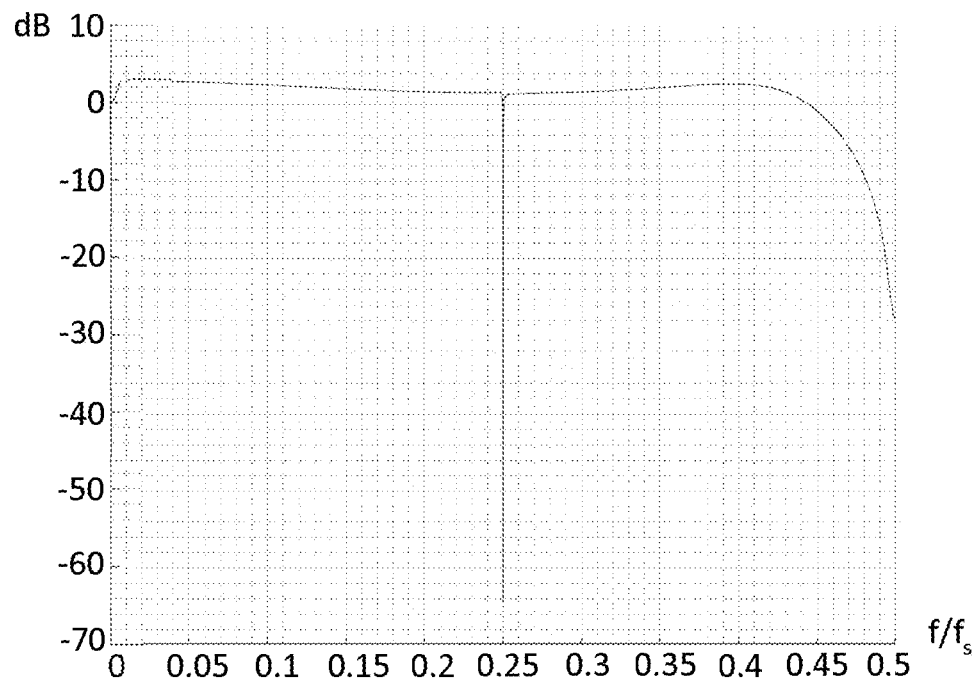
FIG. 10 shows a simulated signal spectrum of an output of a signal processing module if regular spinning is applied and with extra offset feedback paths.

FIG. 9 and FIG. 10 show the simulated output spectra if regular spinning is applied (the sequence d(n) is then +1,+1,−1,−1 repeated regularly). FIG. 9 shows the output spectrum without the two extra feedback paths, and FIG. 10 shows the output spectrum with the two extra feedback paths. In the figures the magnitude of the output spectra (in dB) is shown in function of the normalized frequency ($f/f_s$). One clearly sees that without the half-chop-rate feedback loops (FIG. 9), a relatively large parasitic tone due to spinning is present at fs/4. In contrast, when the prior art half-chop-rate feedback loops are activated (FIG. 10), they introduce a notch at fs/4. The width of the notch is related to the magnitude of, i.e. to the strength of the half-chop-rate feedback paths. The above simulation shows that an input signal near fs/4 may be significantly reduced, and even completely eliminated.

In the following paragraphs the use of the spread-spectrum offset feedback loops (i.e. with randomized spinning) in accordance with embodiments of the present invention is discussed. For the same linear chirp from DC to fs/2, the simulation results are as illustrated in FIG. 11 and FIG. 12.

Figure 11:
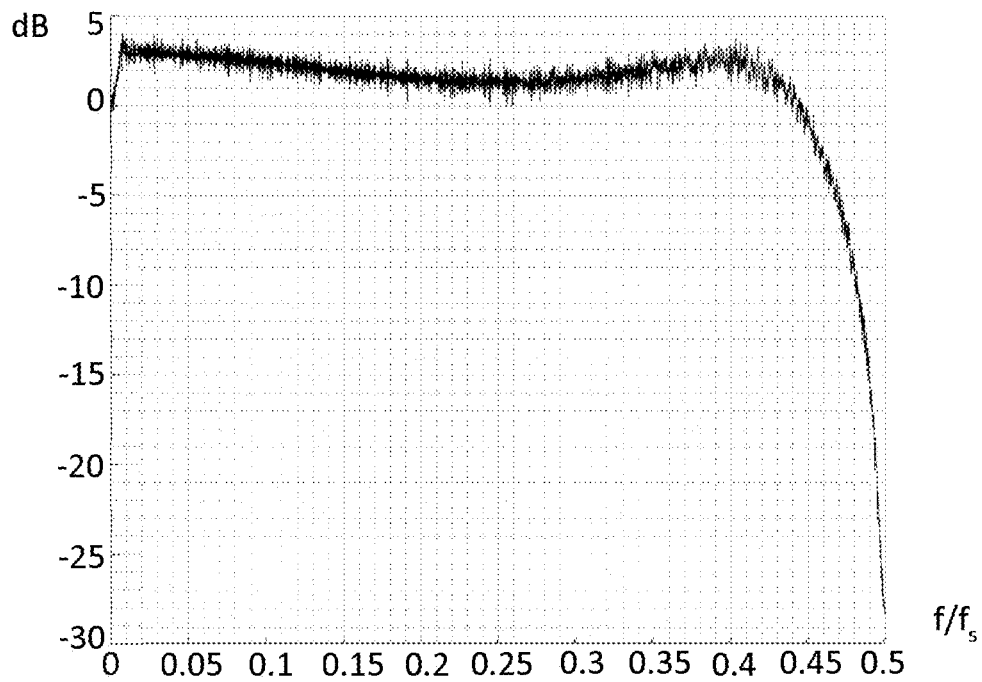
FIG. 11 shows a simulated signal spectrum of an output of a signal processing module if white spinning is applied (i.e. random spinning with a white noise characteristic) and with active feedback in accordance with embodiments of the present invention.
Figure 12:
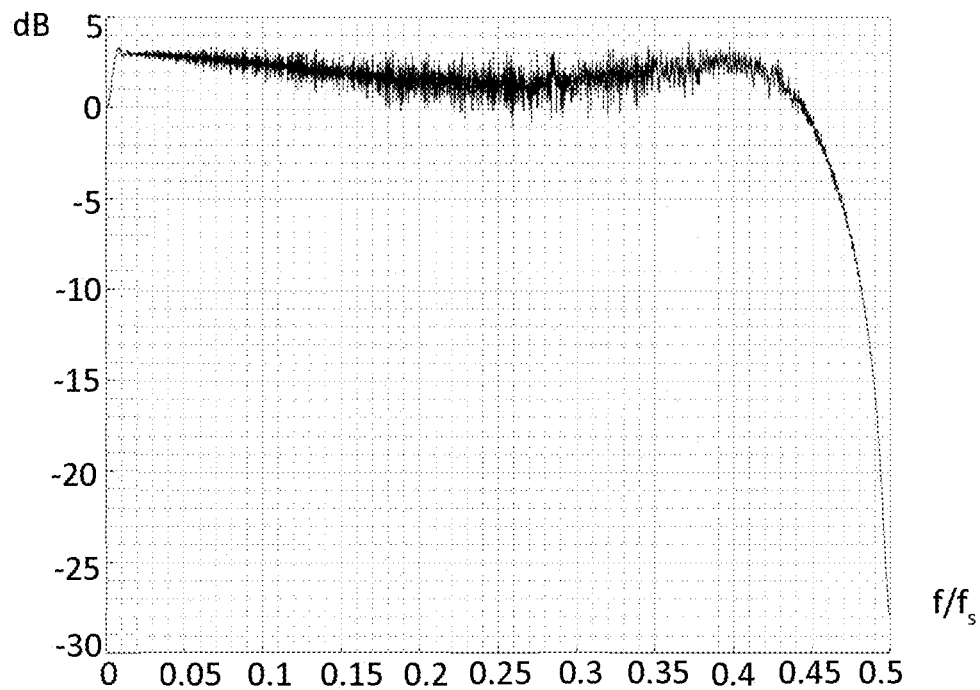
FIG. 12 shows a simulated signal spectrum of an output of a signal processing module if shaped spinning is applied (i.e. random spinning with a shaped noise spectrum) and with active feedback in accordance with embodiments of the present invention.

FIG. 11 illustrates the simulated output spectrum when a white random signal is used for d(n), while for FIG. 12 when a band-pass shaped random signal has been used. The input frequencies near fs/4 are now no longer blocked but appear amplified at the output. However, the randomized spinning also introduces some extra "noise". This extra "noise" can be shown to raise and drop in a way proportional to the input (or output) signal. The main mechanism involved is that the amplified input signal is also processed by the spread-spectrum offset feedback loops, where it gets randomly modulated and integrated. As a result, the integrator output fluctuates around its correct value, leading to imperfect cancellation of the $V_X$ and $V_Y$ related terms. This manifests itself as a randomized signal appearing at the amplifier input which scales with the magnitude of the output signal (hence also with the magnitude of the input signal). In FIG. 11, i.e. when using white random signals for controlling spinning and chopping, the extra "noise" is fairly evenly spread over all frequencies. In contrast, in FIG. 12 less noise is present at low frequencies, at the cost of somewhat more noise around the midpoint fs/4. This demonstrates the usage of shaped random spinning for avoiding the extra noise in some special regions of interest. It is clear that in case of FIG. 12 if the output signal would be sufficiently lowpass filtered, the "extra" noise could be almost completely eliminated.

Figure 13:
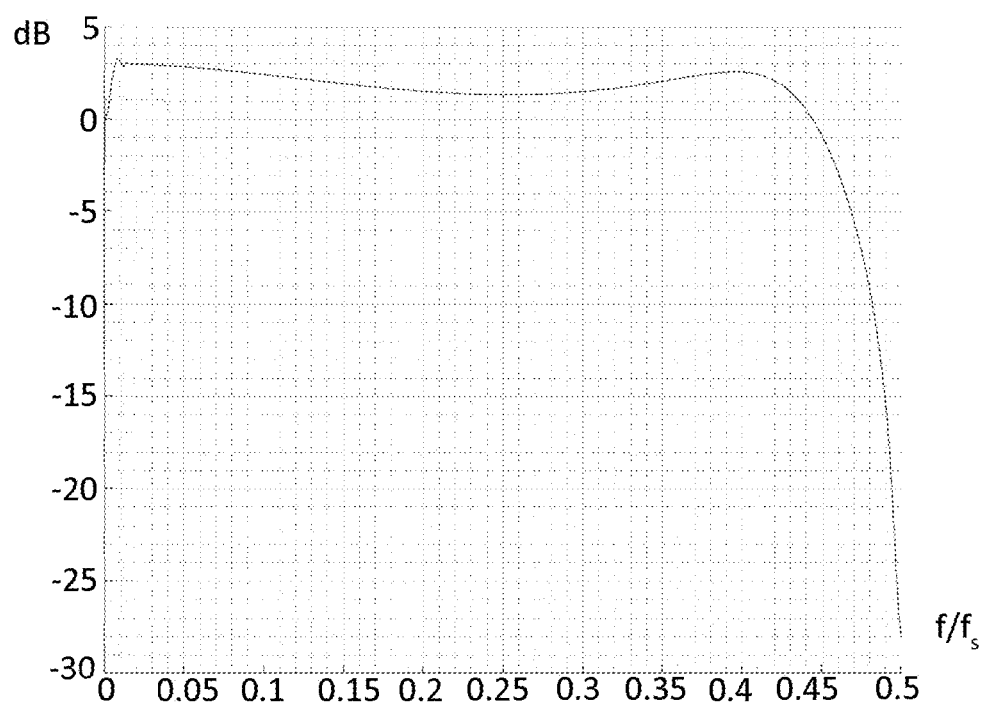
FIG. 13 shows a simulated signal spectrum after freezing of the offset feedback loops of a signal processing module with active offset feedback and wherein shaped spinning is applied at startup in accordance with embodiments of the present invention.

An interesting embodiment of the present invention is now to apply randomized spinning only at startup, or during some calibration phase. After some time, the feedback loops are frozen, and regular spinning is from then on applied. The output collected after freezing of the feedback loops is shown in FIG. 13. There is no extra noise present now. One can still perceive a very small deviation at fs/4, which is caused by incomplete cancellation of $V_X$ and $V_Y$. As has been described above, disturbances corresponding to randomly modulation circulate in the spread-spectrum reduction loops. When freezing the feedback loops, a constant error may remain, leading to some small residual fs/4 tone. Still, the important point is that the randomized spinning scheme succeeded in significantly reducing the magnitude of this parasitic fs/4 tone. This can be done, even in the case when the (unknown) external magnetic field has an important spectral component at fs/4.

In the above simulations, the zero-order hold output of the considered LNA has been selected as the output of the signal processing module. Similar conclusions can be drawn when selecting another output, e.g. the integrator output signal of the considered LNA.

The invention claimed is:

1. A method for measuring a magnetic field by reading out a Hall plate which comprises at least 4 contacts, the method comprising:
    reading out two of the contacts while biasing two other contacts of the at least 4 contacts thereby obtaining a readout signal,
    switching biasing and readout contacts according to a random or pseudo-random sequence of phases, each phase corresponding with a different permutation of biasing and readout contacts selected from the at least 4 contacts of the Hall plate wherein the biasing and readout contacts are selected such that the readout signal is a measure for the magnetic field,
    processing of the readout signal to obtain a readout of the Hall plate representative for the magnetic field,
    wherein the random sequence of phases is generated by a combination of a first sequence and a second sequence, wherein the first sequence or the second sequence is a random or pseudo-random sequence, and
    wherein the phases are grouped and the first sequence controls which group is selected, while the second sequence influences the choice between phases within the group.

2. The method according to claim 1, wherein the processing of the readout signal comprises applying at least one offset feedback loop on the readout signal.

3. The method according to claim 2 wherein the at least one offset feedback loop comprises a chopper operated in a randomized way dependent on the random or pseudo-random sequence of phases.

4. The method according to claim 1, wherein the at least one random or pseudo-random sequence is a pseudo-noise sequence.

5. The method according to claim 1, wherein the at least one random or pseudo-random sequence has a spectral density with a predefined spectral shape.

6. The method according to claim 5, wherein the at least one random or pseudo-random sequence has a high-pass spectral density.

7. The method according to claim 5, wherein the at least one random or pseudo-random sequence has a band-pass spectral density.

8. The method according to claim 1, wherein the at least one random or pseudo-random sequence is generated by means of a digital-domain Sigma-Delta modulator.

9. The method according to claim 1 wherein at least one sequence is an alternating sequence.

10. The method according to claim 1, wherein the first sequence and the second sequence is a random or pseudo-random sequence.

11. A readout device for measuring a magnetic field by reading out a Hall sensor comprising at least 4 contacts, the device comprising:

a biasing circuit connectable to a pair of the contacts and configured to force a current from one connected contact to the other connected contact, a readout circuit connectable to a pair of the contacts and configured to obtain a readout signal from the connected contact pair, a switch matrix configured to connect the biasing circuit to a pair of the contacts of the Hall sensor and to connect the readout circuit to another pair of the contacts of the Hall sensor, a controller configured to control the switching matrix according to a random or pseudo-random sequence of phases, each phase corresponding with a different permutation of biasing and readout contacts selected from the at least 4 contacts of the Hall plate, wherein the biasing and readout contacts are selected such that the readout signal is a measure for the magnetic field, and wherein the controller is configured to obtain the random sequence of phases by combining a first sequence and a second sequence, wherein the first sequence or the second sequence is a random or pseudo-random sequence, and wherein the phases are grouped and the first sequence controls which group is selected, while the second sequence influences the choice between phases within the group, and a signal processing module connected with the readout circuit and configured to process the readout signal to obtain a readout of the Hall plate representative for the magnetic field.

12. The readout device according to claim 11, wherein the signal processing module comprises at least one offset feedback loop.

13. The readout device according to claim 11, wherein a first offset feedback loop is configured for operating at a frequency of the first sequence, and a second offset feedback loop is configured for operating using the second sequence as chopper signal and a third offset feedback loop is configured for operating using a product of the first and the second sequence as chopper signal.

14. The readout device according to claim 12, wherein at least one offset feedback loop comprises an integrator.

15. The readout device according to claim 11, wherein wherein the first sequence and the second sequence is a random or pseudo-random sequence.

* * * * *